United States Patent
Wang et al.

(10) Patent No.: US 6,627,482 B2
(45) Date of Patent: Sep. 30, 2003

(54) MASS PRODUCTION TECHNIQUE FOR SURFACE MOUNT OPTICAL DEVICE WITH A FOCUSING CUP

(75) Inventors: Bily Wang, Hsin-Chu (TW); Bill Chang, Hsin-Chu (TW)

(73) Assignee: Harvatek Corporation, Hsin-Chu (TW)

(*) Notice: Subject to any disclaimer, the term of this patent is extended or adjusted under 35 U.S.C. 154(b) by 0 days.

(21) Appl. No.: 09/779,407

(22) Filed: Feb. 9, 2001

(65) Prior Publication Data

US 2002/0110951 A1 Aug. 15, 2002

(51) Int. Cl.[7] .............................................. H01L 21/48
(52) U.S. Cl. ........................ 438/116; 438/24; 438/118; 257/696
(58) Field of Search ................................ 438/106, 107, 438/113, 118, 460, 24, 116; 257/81, 696, 734

(56) References Cited

U.S. PATENT DOCUMENTS

| 5,177,593 A | * | 1/1993 | Abe .............................. 257/98 |
| 5,302,849 A | * | 4/1994 | Cavasin ...................... 257/666 |
| 5,357,056 A | * | 10/1994 | Nagano ...................... 174/52.4 |
| 5,618,759 A | * | 4/1997 | Boysel ........................ 438/464 |
| 5,747,877 A | * | 5/1998 | Wilson ........................ 257/703 |
| 5,937,277 A | * | 8/1999 | Matsuda et al. ............ 438/119 |
| 5,962,917 A | * | 10/1999 | Moriyama .................. 257/697 |
| 6,078,099 A | * | 6/2000 | Liu et al. .................... 257/676 |

* cited by examiner

Primary Examiner—Amir Zarabian
Assistant Examiner—Pamela Perkins
(74) Attorney, Agent, or Firm—H. C. Lin, Patent Agent

(57) ABSTRACT

Surface mount diodes are mass produced by first cutting a metal plate to form a plurality of vertical slits within metal plate. Parallel lines are cut midway between the slits to form wings for the slits. The wings are folded to form the bottoms for surface mounting. Glue is applied over the metal plate to form focusing cups.

12 Claims, 18 Drawing Sheets

MASS PRODUCTION TECHNIQUE FOR SURFACE MOUNT OPTICAL DEVICE WITH A FOCUSING CUP

BACKGROUND OF THE INVENTION

1. Field of Invention

This patent application is copending with U.S. patent application Ser. No. 09/731,223. This invention relates to optical semiconductor device package, particularly to packages with focusing cups. The semiconductor device may be a light emitting device such as diode, a laser diode, . . . etc. The semiconductor diode may also be a light absorbing device such an image sensor, photo diode . . . etc.

2. Brief Description of Related Art

FIGS. 1–5 show a prior art technique of fabricating a diode package with a focusing cup. A metal plate is punched with holes 15 to yield a matrix of frames 13. Each frame has two metal plates 11, 12. The first metal plate 11 has two horizontal ends, the inner end 111 and outer end 112. The second metal plate 12 has horizontal ends, the inner end 121 and outer end 122.

In the next step, the metal plates 11, 12 are partially covered with an insulating material such as glue to form a cup 10 and bottom support 14 as shown in the top view FIG. 2. The cup is lined with reflecting coating to focus the light emitted from the diode.

Each semi-finished unit has the outer ends of the metal plates 112 and 122 extending outside the cup 10 as tabs. The section view along the section line A–A' is shown in FIG. 4. The inner end 121 is mounted with the optical diode, which is wire bonded to the inner end 111.

The outer end 112 of metal plate 11 and the outer end 122 of metal plate 12 are then folded as shown in FIG. 5 to form the bottom contacts of the surface mount package.

Such a structure requires a thick support 14 to withstand the bending moment of the outer end 112 of metal plate 11 and outer end 122 of metal plate 12 as described in a copending U.S. patent application Ser. No. 09/731,223, which disclosed a method of using a pre-formed folded frame to reduce the thickness of the package.

SUMMARY OF THE INVENTION

An object of this invention is to provide a method of mass production of the folded frame structure disclosed in copending U.S. patent application Ser. No. 09/731,223. Another object of this invention is to reduce the cost of fabricating an optical diode package with a focusing cup.

These objects are obtained by preforming the folded bottom contacts of surface mount optical diodes on a metallic substrate before the substrate is diced into individual packages. The metallic substrate is cut with vertical parallel slits inside the horizontal edges of the substrate. Lines parallel to the slits are cut between the slits to form two wings for each slit. The two wings are folded to form the bottom contacts for the surface-mount package. Glues are poured into a mold over and under the metal substrate to form focusing cups and bottom support 14. The metal substrate and the glue are then diced to form individual packages. The diodes are mounted inside the cups and connected to the divided metal leads at the bottoms of the cups.

DETAILED DESCRIPTION OF THE INVENTION

Figure 1:
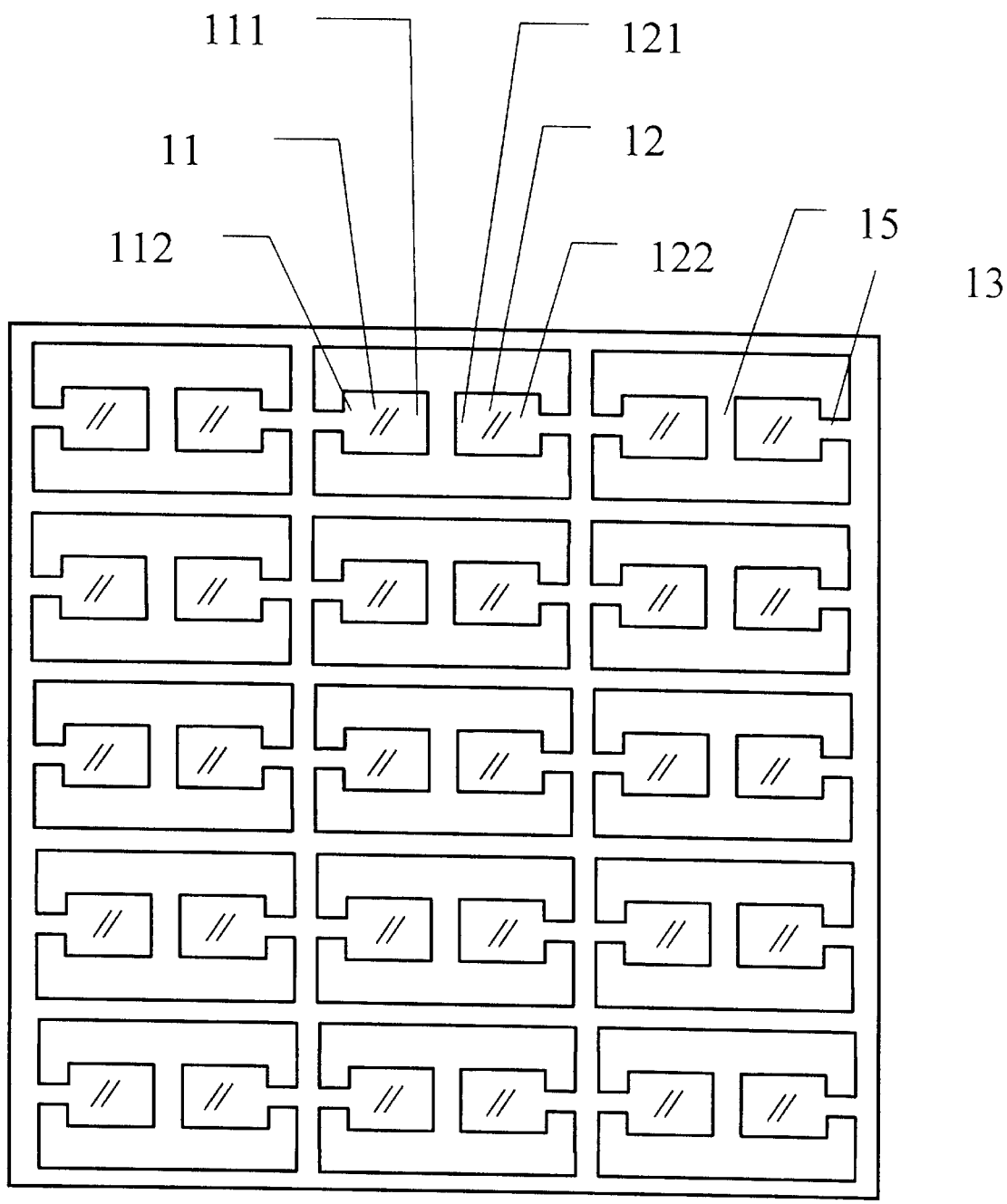
FIG. 1 shows the prior art frame for mass producing the optical diode packages with the focusing cups.
Figure 2:
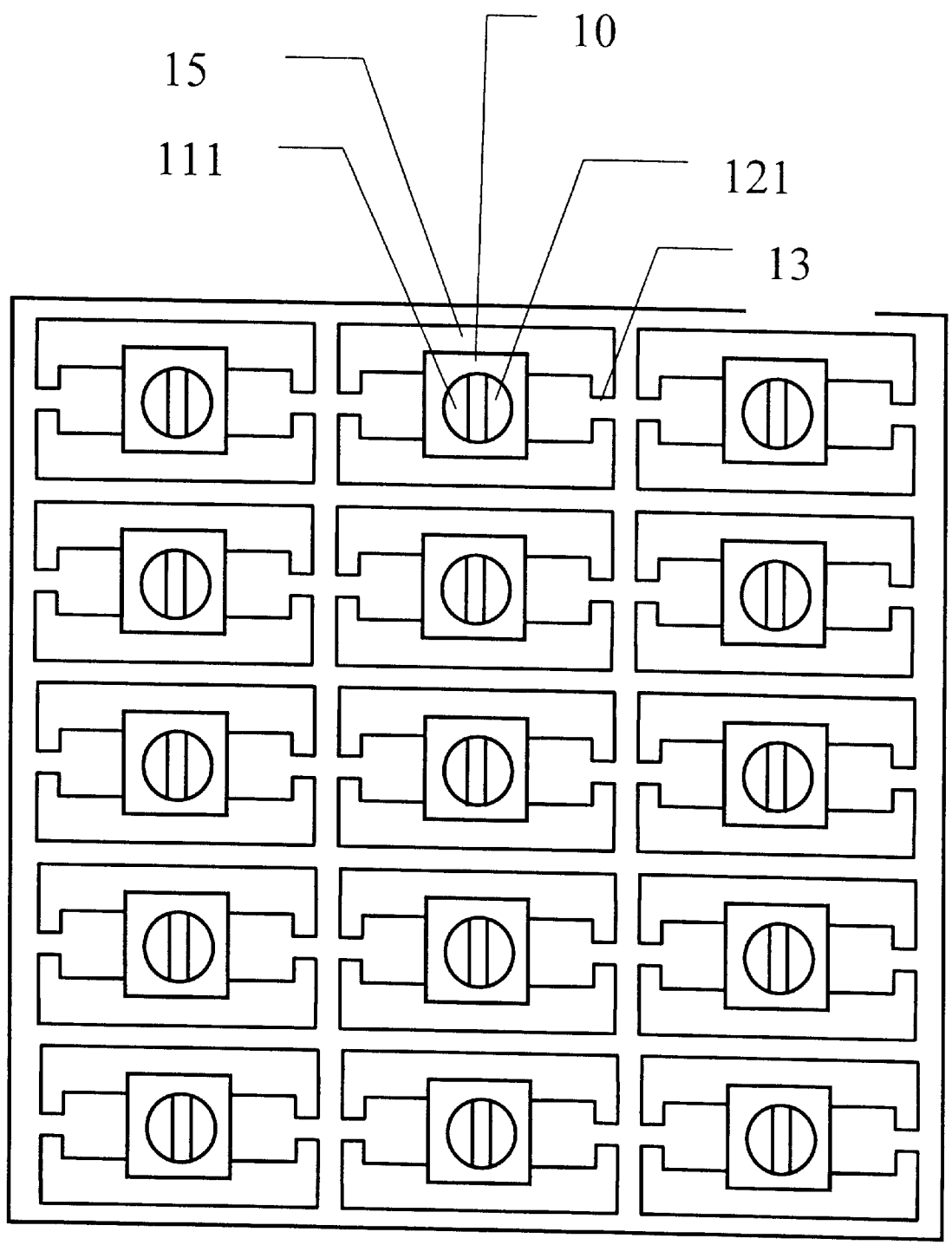
FIG. 2 shows the mounting of the cups on the frame in FIG. 1
Figure 3:
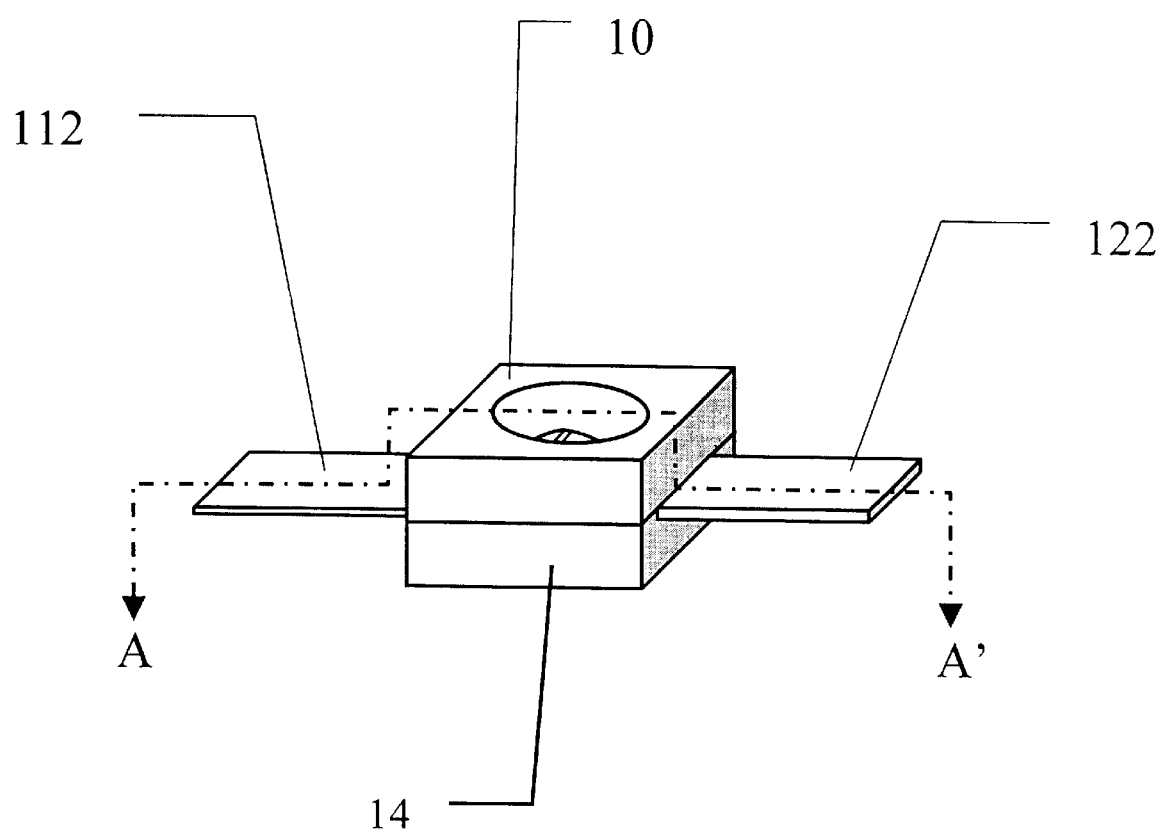
FIG. 3 shows the individual unit.
Figure 4:
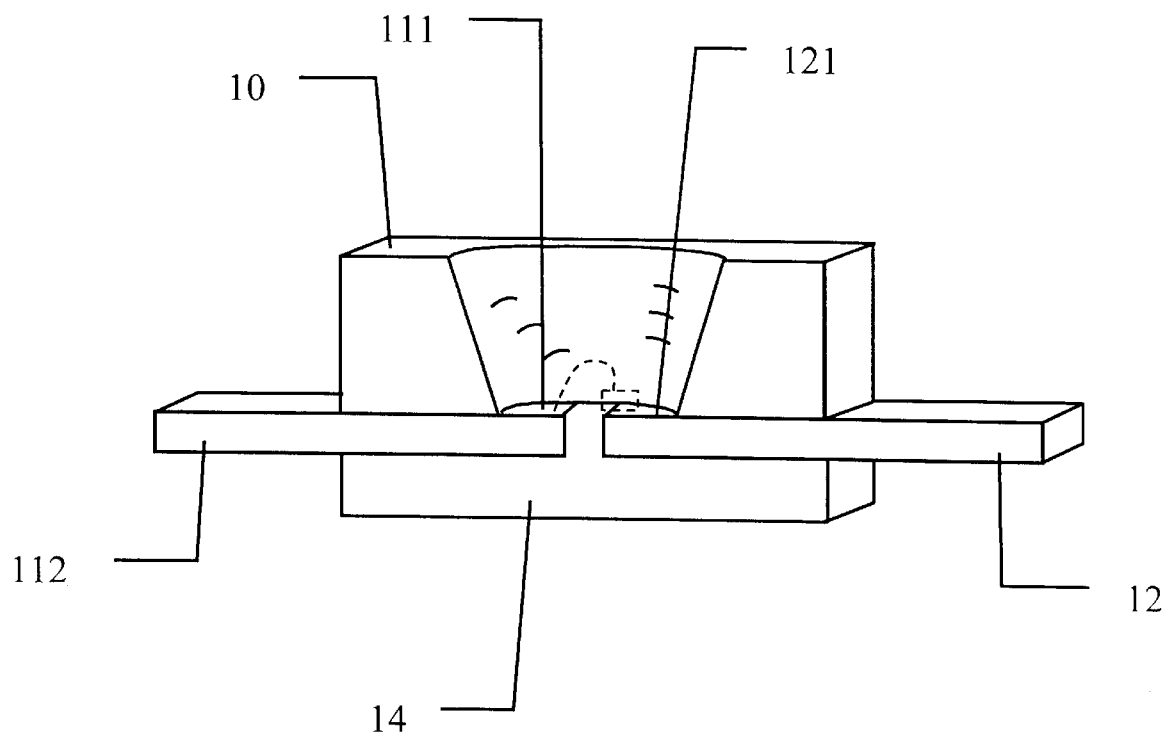
FIG. 4 shows the cross-section view of the diode with a focusing cup.
Figure 5:
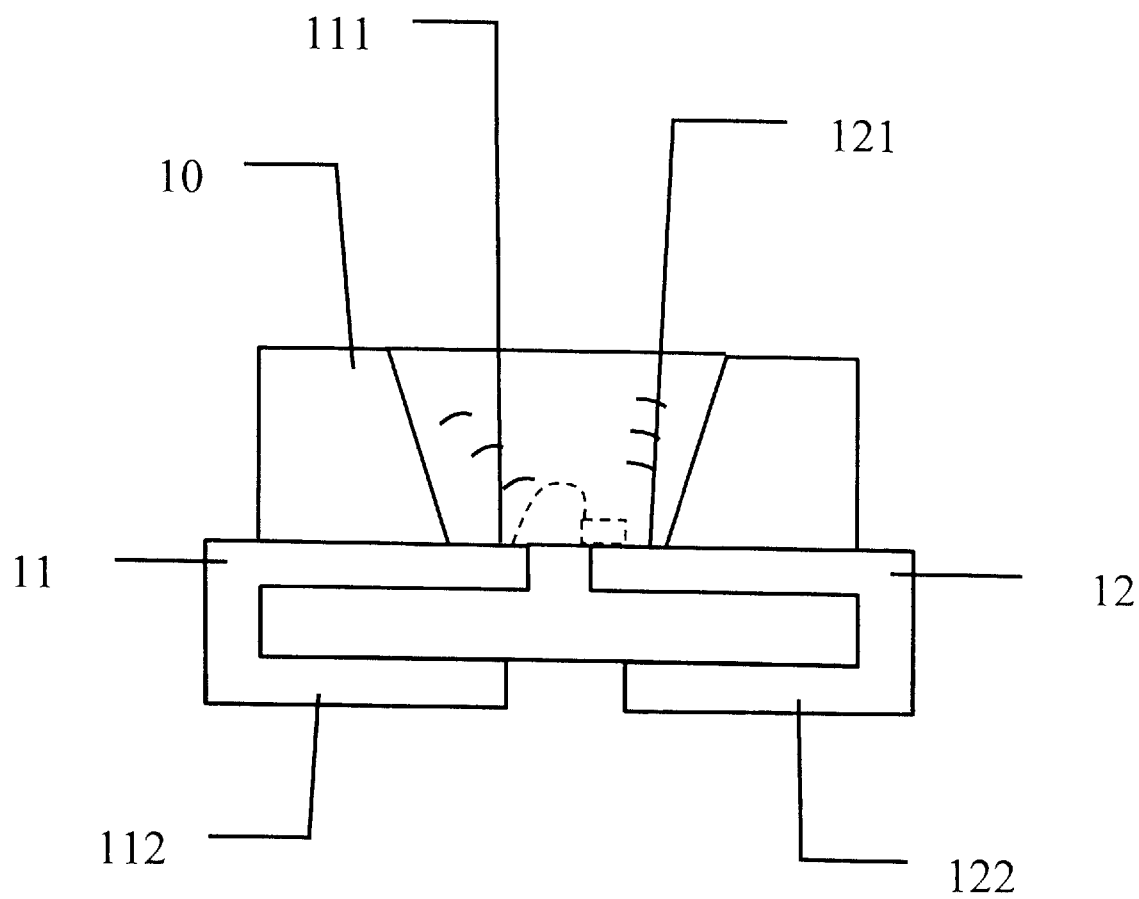
FIG. 5 shows the folding of the bottom contacts for surface mounting.
Figure 6:
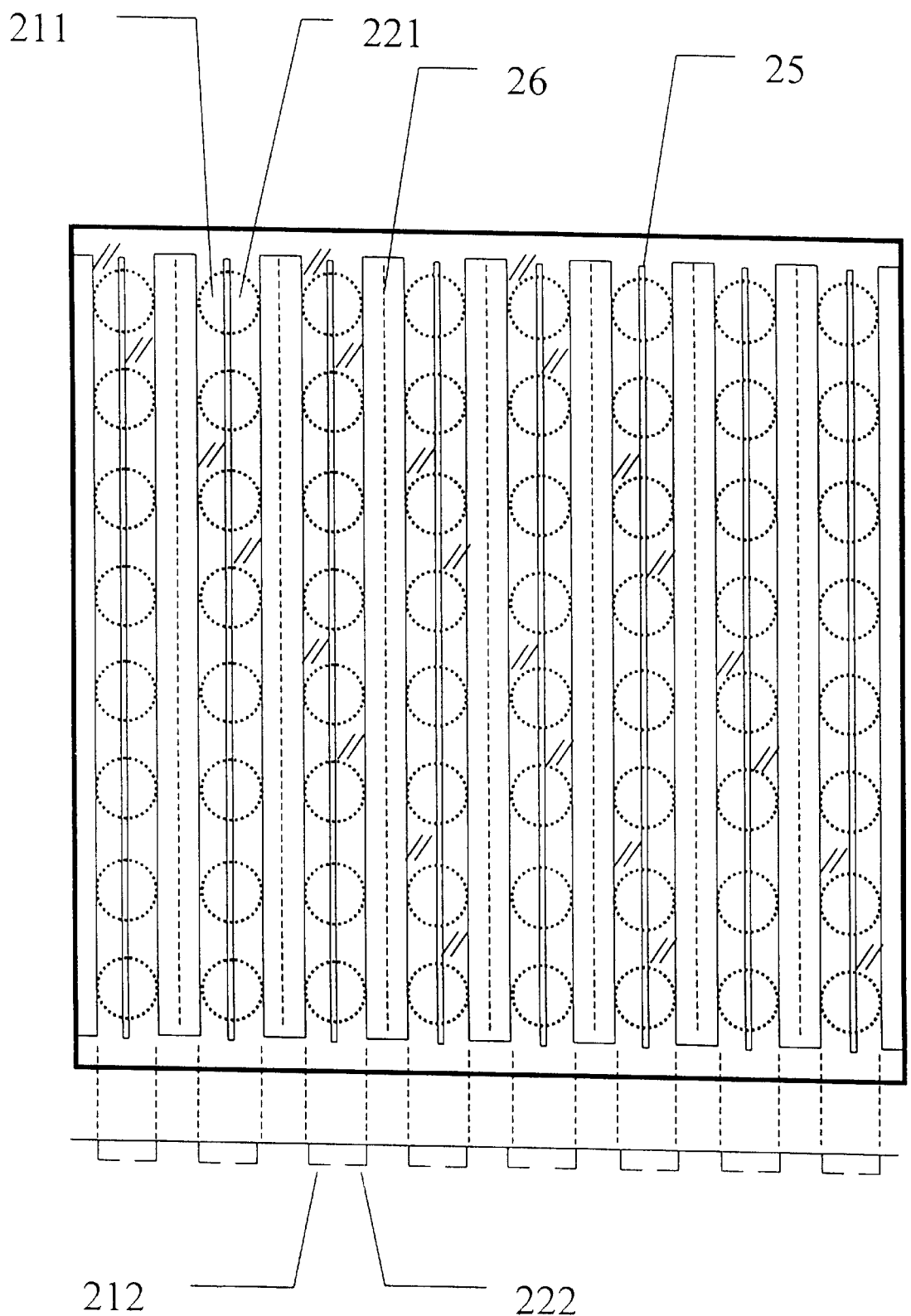
FIG. 6 shows the basic structure of the metallic substrate of the present invention.

FIG. 6 shows a common metal substrate for mass producing surface mount optical diodes with focusing cups. The common metallic substrate is cut with vertical slits 25 and cut along the dotted lines 26. The wings 211 and 221 created by the cuts 26 are folded downward along the horizontal edges of the dotted circle as bottom contacts 212 and 222, respectively, of a surface mount package. While FIG. 6 shows the slits 25 are shown as a number of single long slits, the individual slits may be sectionalized the strengthen the structure.

Figure 7:
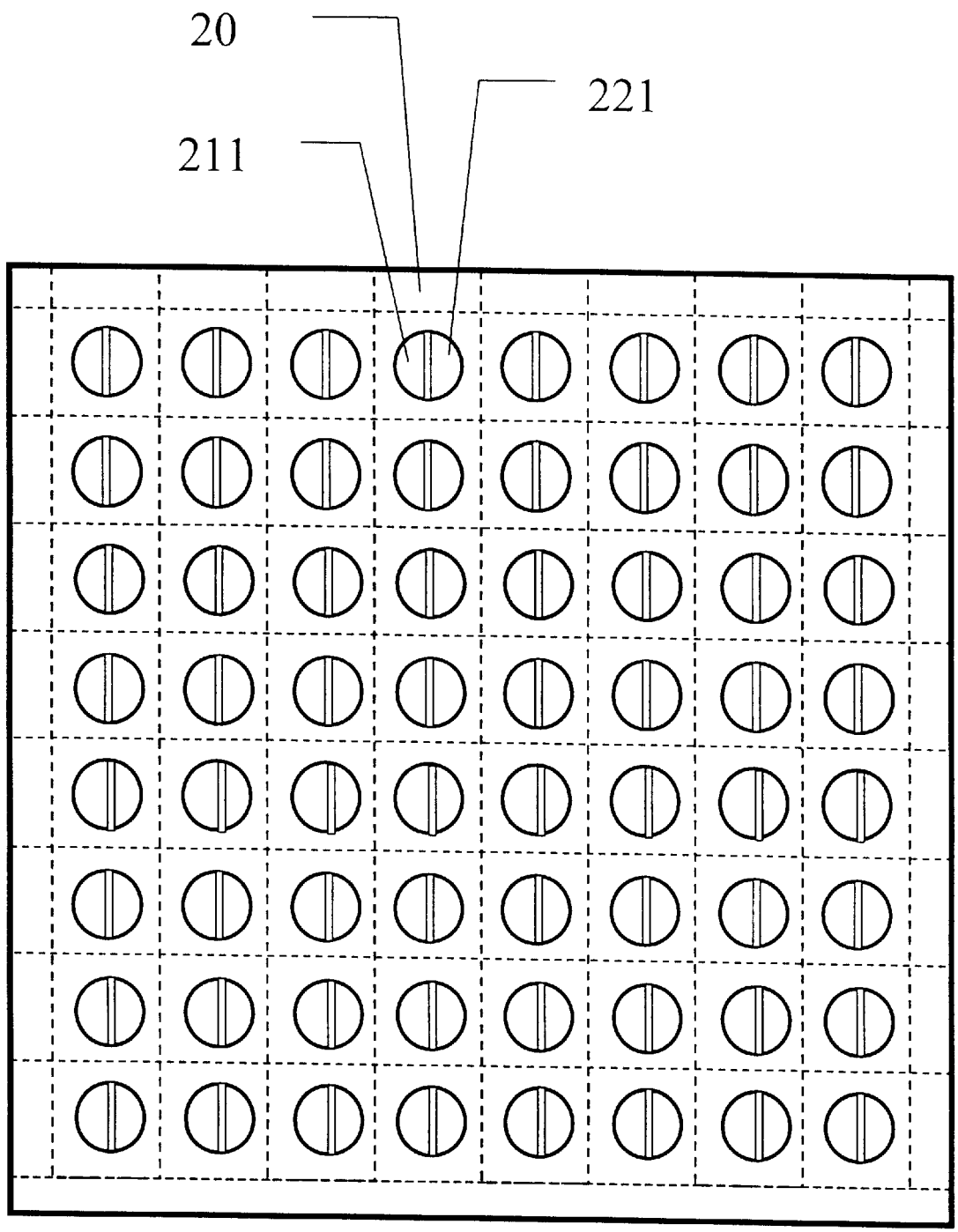
FIG. 7 shows the mounting of the focusing cups over the metallic substrate.

FIG. 7 shows that the metal frame is then covered with insulating material 20 (usually glue) except in the circular cups to expose the inner terminals 211 and 221.

Figure 8:
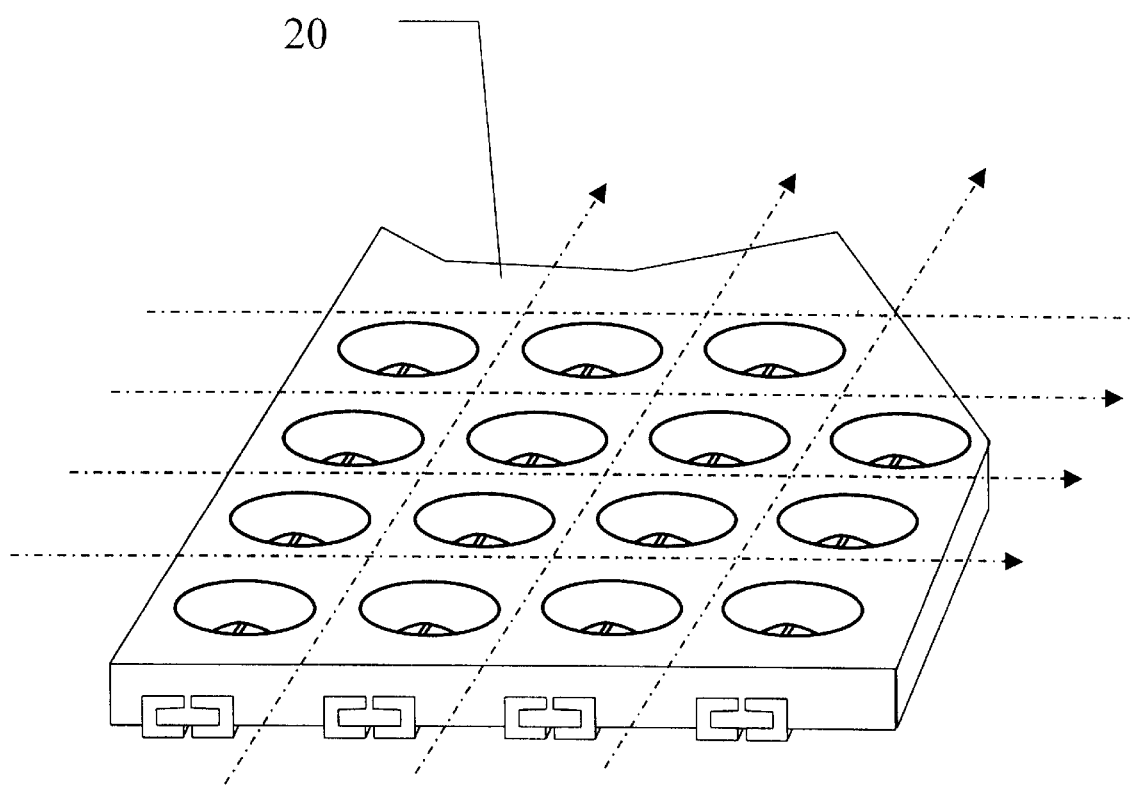
FIG. 8 shows the 3-dimensional view of the structure shown in FIG. 7.

FIG. 8 shows the three dimensional view of FIG. 7 with cups surrounded by insulating walls 20. Note that the folded ends of the wings contact at the bottom of the walls 20. The chips are then mounted and wire-bonded in the cups. The structure is then sawed along the dot-dash horizontal and vertical lines.

Figure 9:
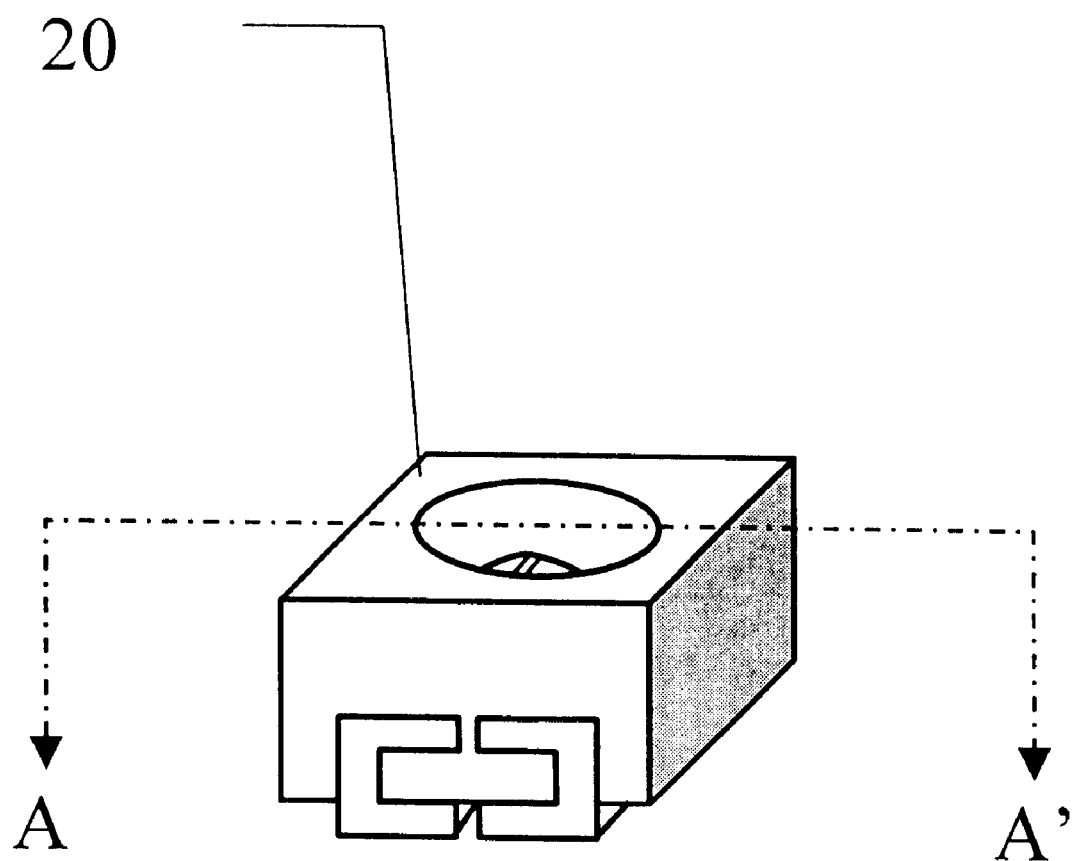
FIG. 9 shows the individual unit after dicing.

FIG. 9 shows individual unit after the sawing step shown in FIG. 8 (chips, wire-bonding and glue within the cup are not shown in FIG. 9).

Figure 10:
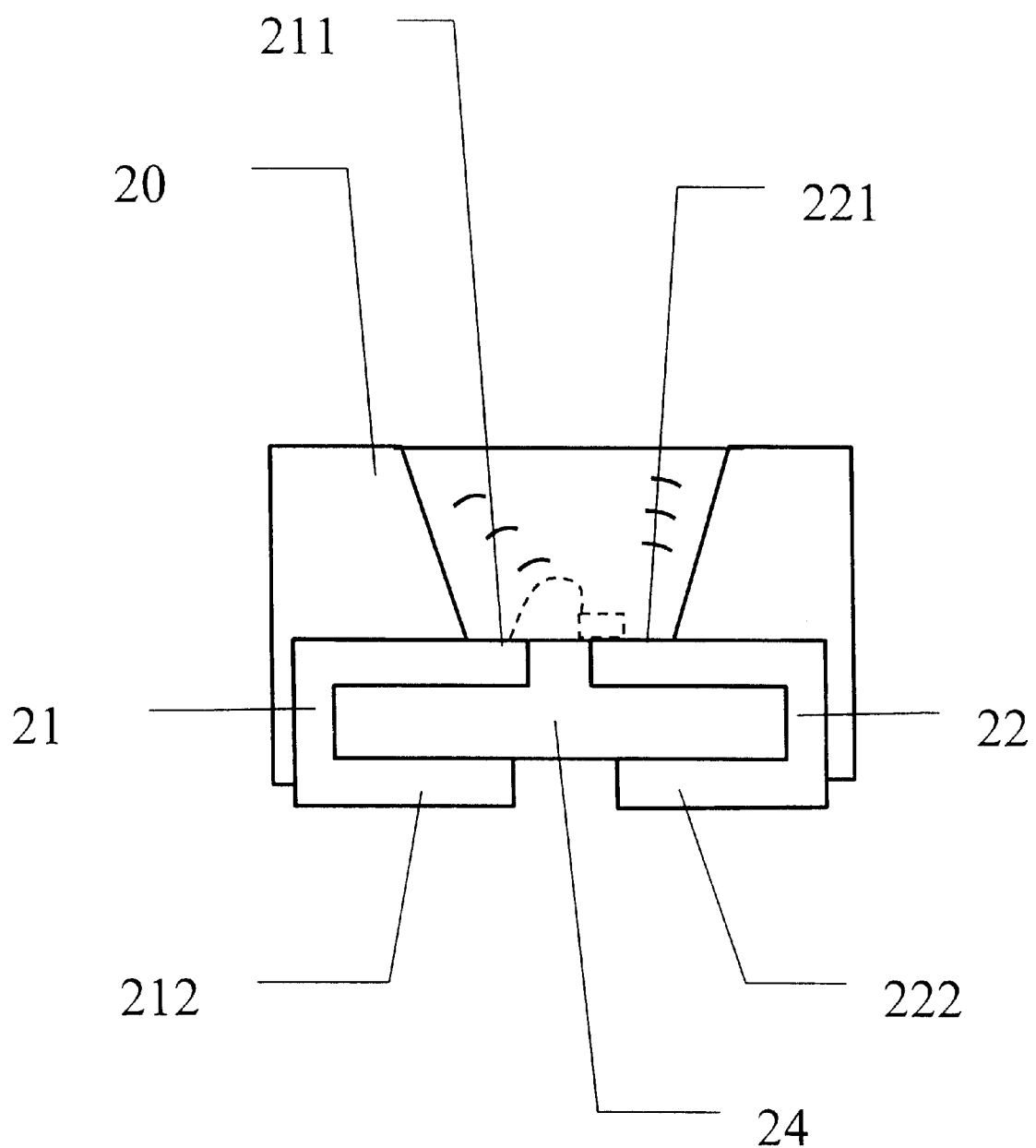
FIG. 10 shows the cross-sectional view of FIG. 9.

FIG. 10 shows the cross-section view of FIG. 9 along the dot-dash section line A–A'. A semiconductor die is mounted on the inner end 221 of metal wing 22 and wire bonded to the inner end 211 of a metal wing 21. The glue forms the wall 20 of the cup over the metal wings 21, 22 and fills the space 24 below the metal wings 21, 22. The bottom surfaces 212 and 222 of the folded metal 21, 22 are not covered with the glue to expose the metal surface for surface mounting to a motherboard. Portions of the upper surfaces 211, 221 of the metal wings are also not covered by the glue to allow the die to be mounted and wire-bonded.

Figure 11:
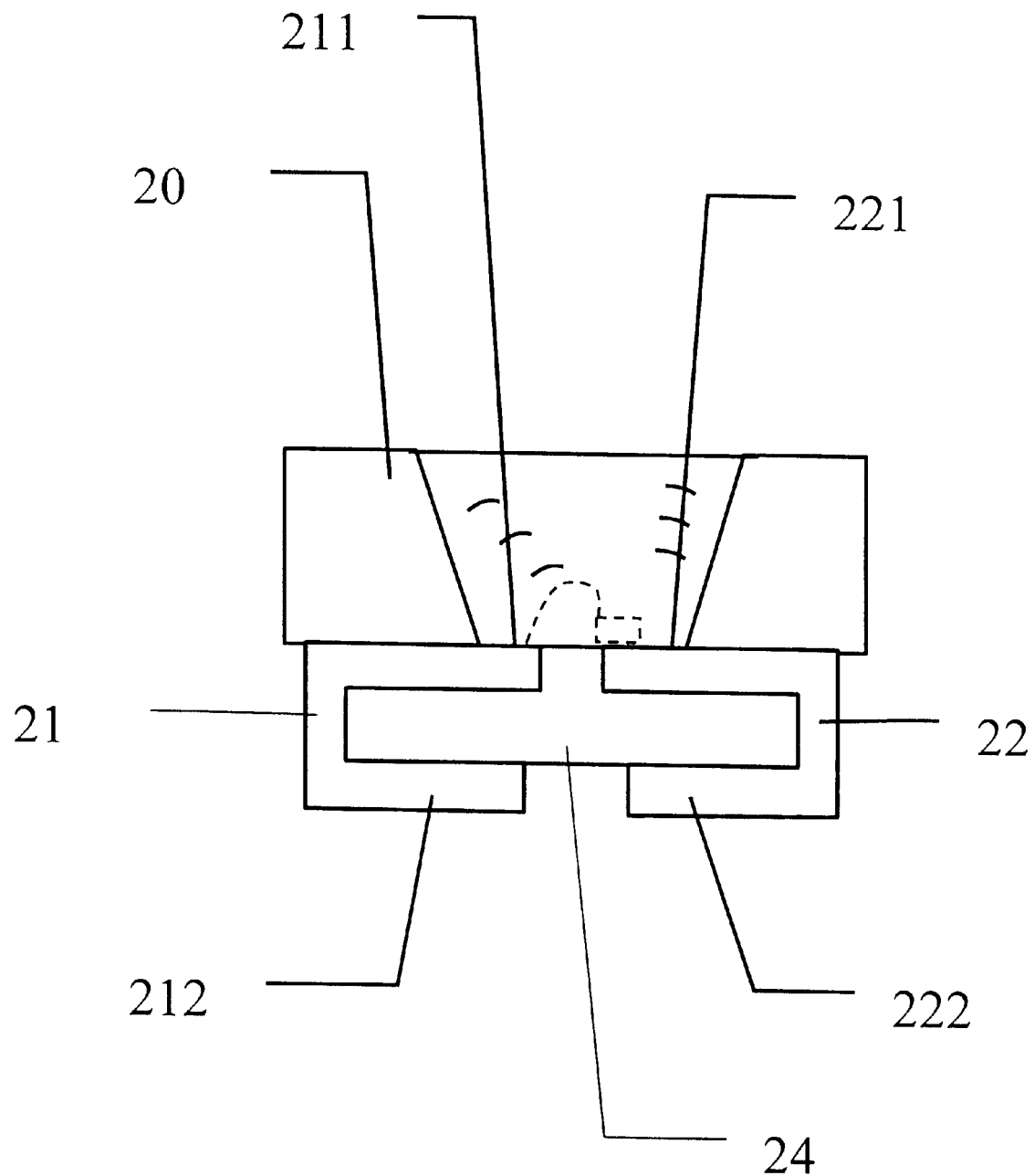
FIG. 11 shows a second embodiment of the present invention.

FIG. 11 shows another embodiment of the present invention which is similar to FIG. 10 except that the vertical folded part of the metal wing is exposed and not covered by the insulating material forming the cups. Exposing the vertical fold has the advantage that during subsequent soldering of the bottom contact to a motherboard, the solder can climb up the vertical wall to insure better soldering. The reference numerals in FIG. 11 correspond to the correspondent reference numerals in FIG. 10.

Figure 12:
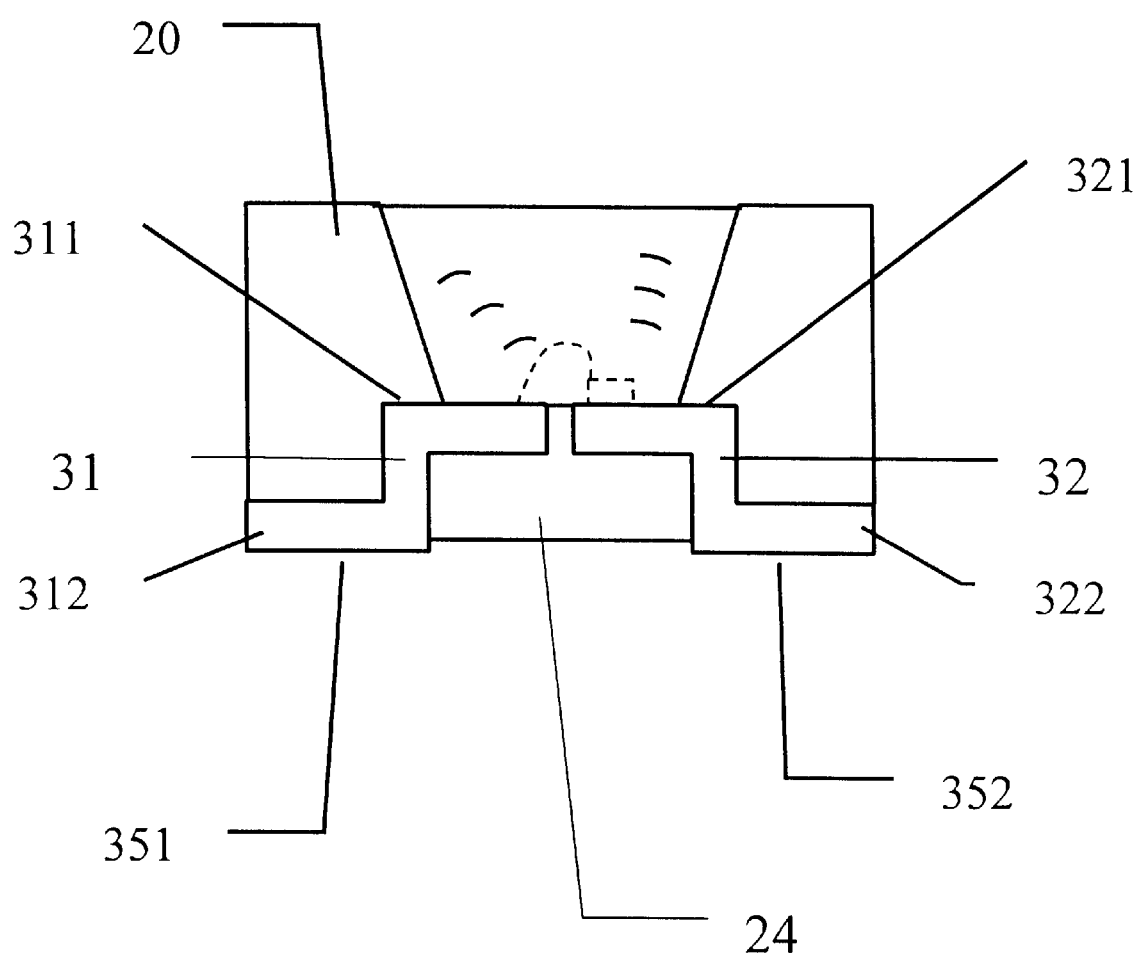
FIG. 12 shows a third embodiment of the present invention.

FIG. 12 shows a third embodiment of the present invention. The metal leads 31 and 32 are folded outward to form bottom contacts 351, 352 for surface mounting to a motherboard. The metal leads 31, 32 are covered with insulating material 20 except in the cup area and have extensions 312,322 respectively bent away from each other. An optical diode chip is mounted on the upper end 321 of the folded metal wing or lead 32 and is wire bonded to the upper end 311 of the metal wing or lead 31.

Figure 13:
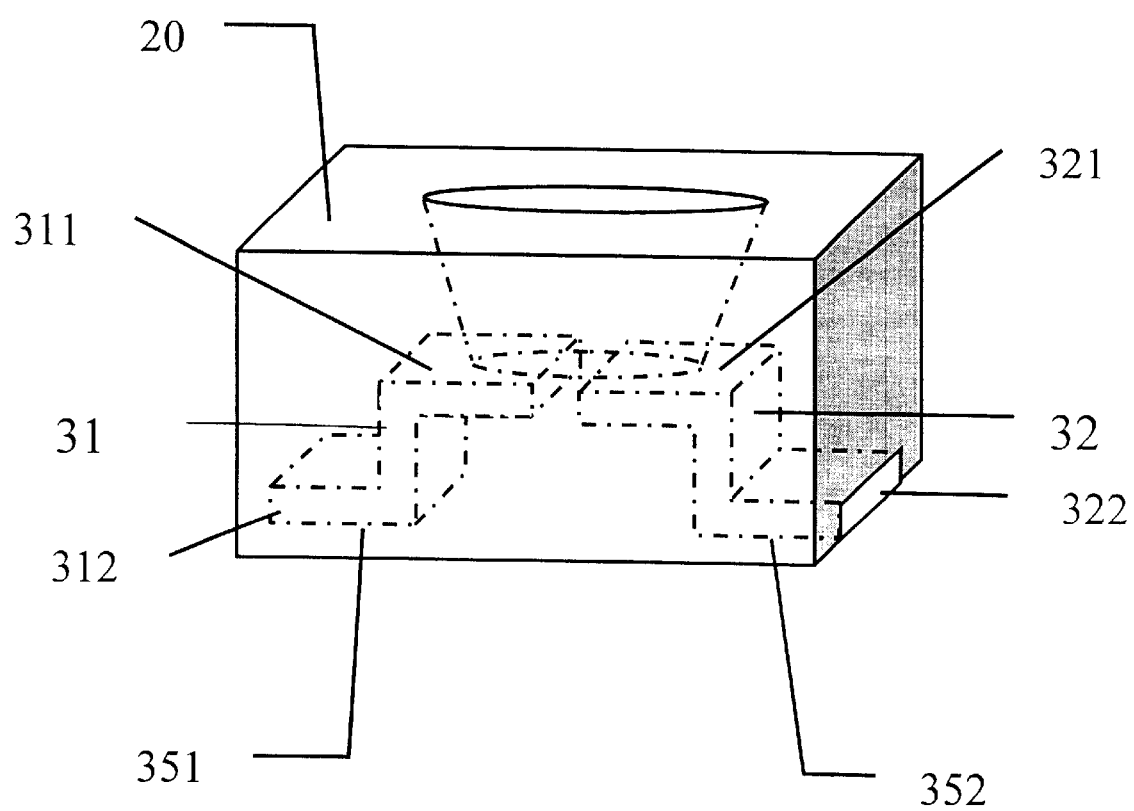
FIG. 13 shows a 3-dimensional view of FIG. 12.

FIG. 13 shows a 3-dimensional view of FIG. 12.

Figure 14:
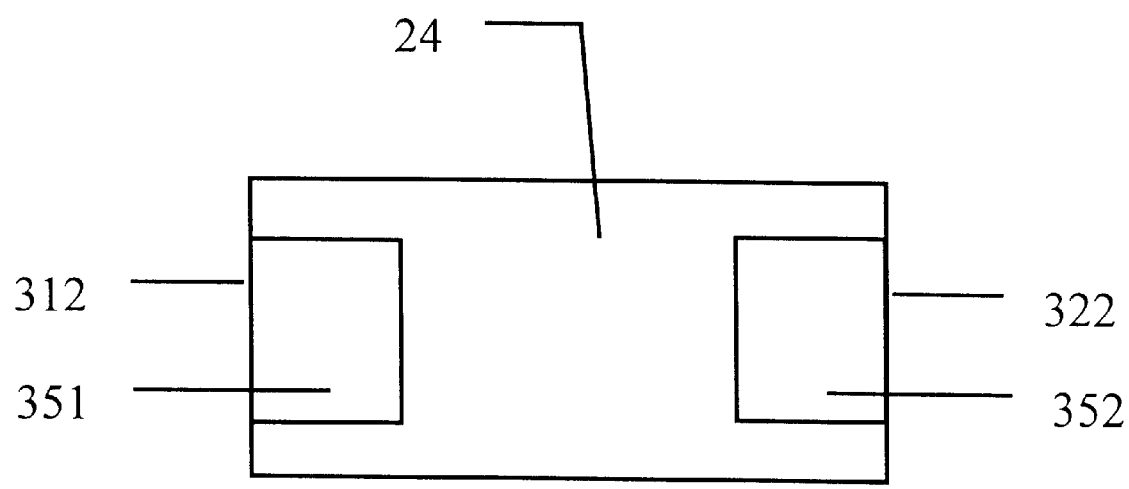
FIG. 14 shows the bottom view of FIG. 12.

FIG. 14 shows the bottom view of FIG. 13 showing the bottom contacts 351, 352 of the metal leads 312, 322 respectively. The two contacts 351 and 352 are separated by an insulator 24.

Figure 15:
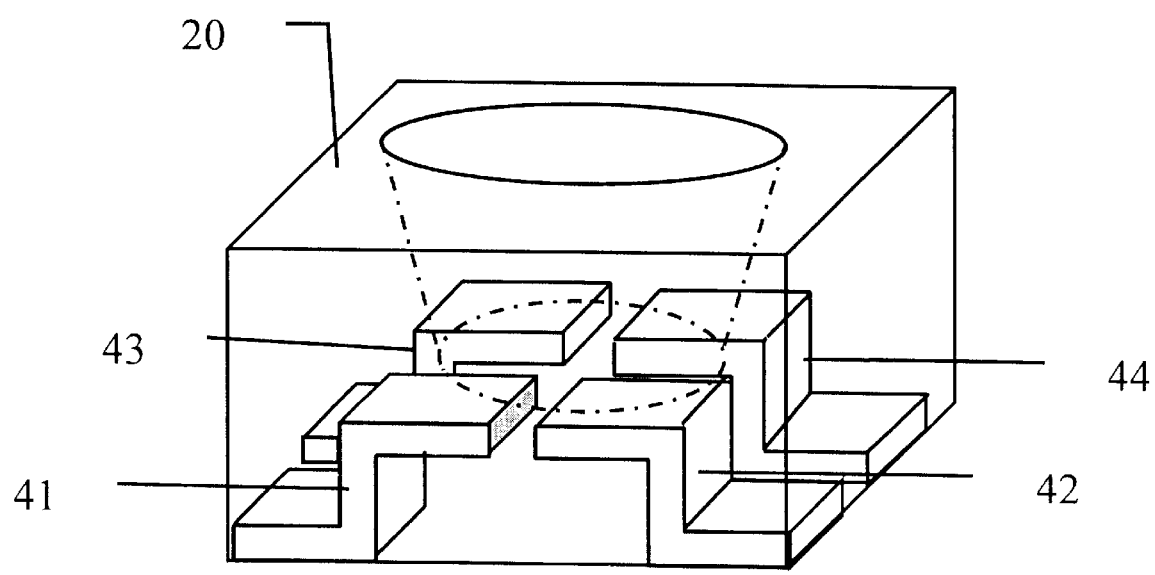
FIG. 15 shows a fourth embodiment of the present invention with the three dimensional view of a multiple lead package.

FIG. 15 shows a fourth embodiment of the present invention for a semiconductor chip with four electrodes. The four electrode semiconductor device (not shown) is mounted inside the focusing cup. Four preformed bent metal frames are used for contacts 41, 42, 43, 44. The shape of each metal leads is similar to that in FIG. 12 with an outwardly bent flange as bottom contact. A glue 20 is cast over the metal frames to form a focusing cup and to seal the entire structure except the bottom of the cup. The bottom of the cup is exposed for connecting the metal plates to the four electrodes of the semiconductor device.

Figure 16:
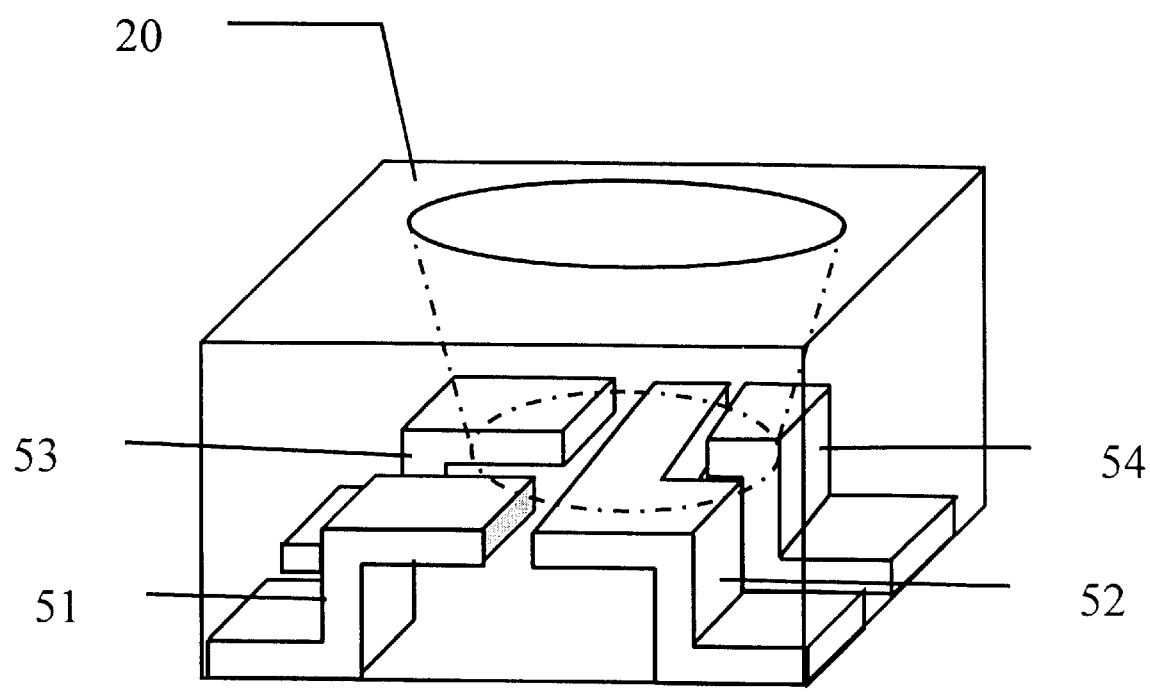
FIG. 16 shows a fifth embodiment of the present invention with multiple lead package.

FIG. 16 shows a fifth embodiment of the present invention. The structure is also for a four-electrode semiconductor device, similar to FIG. 15. However, the bonding pads of the semiconductor device are not symmetrically located. Therefore the shapes of the metal frames are not of the same shape to mate with the bonding pads of the semiconductor device. While the metal leads 51, 53 are similar in shape as metal leads 41, 43 in FIG. 15, the metal leads 52, 54 are different from metal leads 42, 44. Metal leads 53 has a zigzag shape and metal lead has an L-shape. The shapes not limited to these shapes, so long as the top surface of the metal leads can mate with the electrodes.

Figure 17:
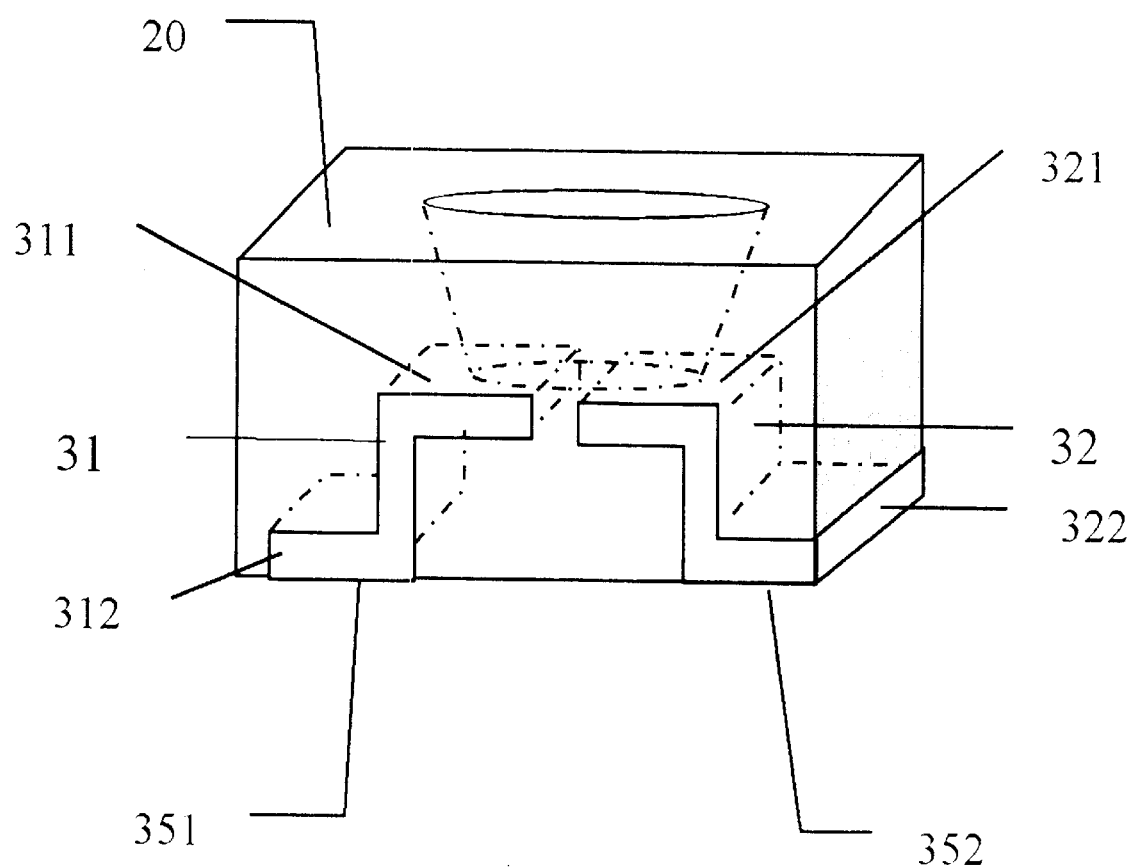
FIG. 17 shows a sixth embodiment of the present invention with zig-zag leads.
Figure 18:
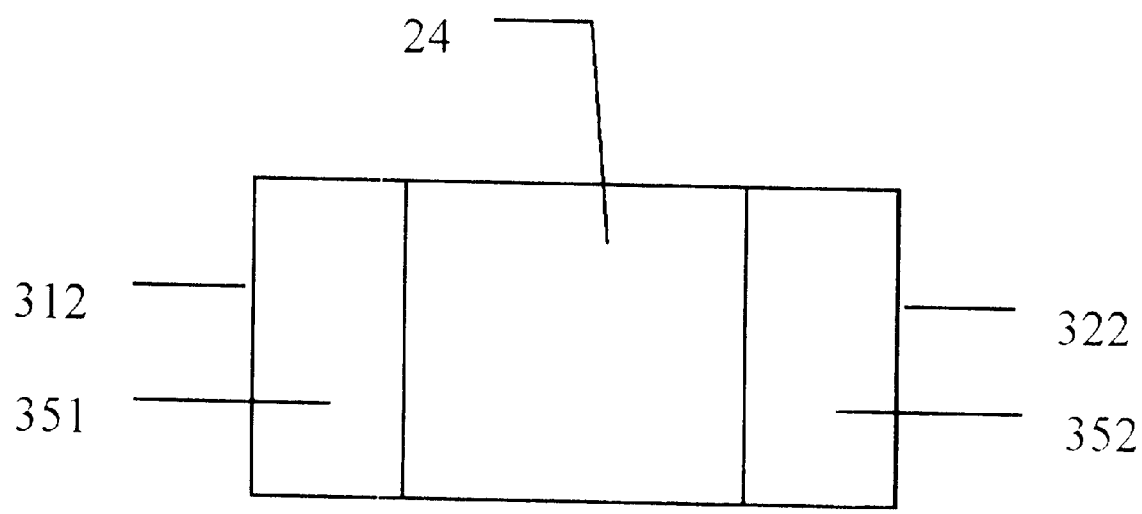
FIG. 18 shows a bottom view of FIG. 17.

FIG. 17 shows a sixth embodiment of the present invention. The structure is similar to FIG. 13, except that the width of the metal leads is flush with the width of the glue 20 covering the leads 31 and 32. FIG. 18 shows the bottom view of FIG. 17.

While the preferred embodiments of the invention have been described. It will be apparent to those skilled in the art that various modifications may be made in the embodiments without departing from the spirit of the present invention. Such modifications are all within the scope of this invention.

What is claimed is:

1. A method of mass producing a surface mount semiconductor device with a focusing cup, comprising the steps of:

cutting a plurality of slits in one direction within a metal plate;

cutting lines parallel to said slits between said slits forming wings for said slits;

folding said wings to form bottom contacts for surface mounting;

covering said metal plate with an insulating glue;

forming matrix of conical focusing cups in said insulating glue for focusing light emitted from a matrix of semiconductor devices to be mounted in said conical focusing cups;

bridging across said slits with said matrix of semiconductor devices at respective bottom of each one of said semiconductor devices; and sawing a plurality of cuts perpendicular to the longitudinal direction of said slits to yield individual dice of said semiconductor devices.

2. The method of mass producing as described in claim 1, wherein said folding folds inward.

3. The method of mass producing as described in claim 1, wherein said folding folds outward.

4. The method of mass producing as described in claim 3, wherein the width of said metal plate is less than the width of the insulating glue.

5. The method of mass producing as described in claim 3, wherein the width of said metal is equal to the width of the insulating glue.

6. The method of mass producing as described in claim 1, wherein said semiconductor device is a diode.

7. The method of mass producing as described in claim 1, wherein said cup is contoured to focus light emitted from said semiconductor device.

8. The method of mass producing as described in claim 1, wherein the top surfaces of said metal plates are shaped to mate with bonding pads of the semiconductor device.

9. The method of mass producing as described in claim 8, wherein the top surfaces of the metal plates are of same shape.

10. The method of mass producing as described in claim 1, wherein the folded part of the leads is covered by said insulating material.

11. The method of mass producing as described in claim 1, wherein the folded part of the leads is not covered by said insulating material.

12. A method of mass producing a surface mount semiconductor device with a focusing cup, comprising the steps of:

cutting a plurality of slits in one direction within a metal plate;

cutting lines parallel to said slits between said slits forming wings for said slits;

folding said wings to form bottom contacts for surface mounting;

covering said metal plate with an insulating glue;

forming a matrix of conical focusing cups for focusing light emitted from semiconductor devises to be mounted in said focusing cups;

mounting each of said semiconductor devices in each of said conical focusing cups;

wherein the top surfaces of the metal plates are of different shapes.

\* \* \* \* \*